United States Patent
Jeong et al.

(10) Patent No.: US 8,421,097 B2
(45) Date of Patent: Apr. 16, 2013

(54) ORGANIC LIGHT EMITTING DIODE DISPLAY DEVICE

(75) Inventors: Hee-Seong Jeong, Yongin (KR); Soon-Ryong Park, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 83 days.

(21) Appl. No.: 12/840,581

(22) Filed: Jul. 21, 2010

(65) Prior Publication Data

US 2011/0084291 A1    Apr. 14, 2011

(30) Foreign Application Priority Data

Oct. 9, 2009 (KR) .......... 10-2009-0096330

(51) Int. Cl.
*H01L 29/20* (2006.01)

(52) U.S. Cl.
USPC ............. 257/89; 257/88; 438/22; 438/28

(58) Field of Classification Search ........... 257/89
See application file for complete search history.

(56) References Cited

U.S. PATENT DOCUMENTS

| | | | |
|---|---|---|---|
| 2003/0019572 A1* | 1/2003 | Low et al. | 156/272.2 |
| 2005/0140288 A1* | 6/2005 | Suzuki | 313/506 |
| 2007/0013302 A1 | 1/2007 | Song et al. | |
| 2008/0023724 A1* | 1/2008 | Takeda et al. | 257/103 |

FOREIGN PATENT DOCUMENTS

| | | |
|---|---|---|
| JP | 2006302878 | 11/2006 |
| JP | 2007-027140 | 2/2007 |
| JP | 2008-218427 | 9/2008 |
| JP | 2008270782 | 11/2008 |
| JP | 2009049003 | 3/2009 |
| KR | 1020060057949 A | 5/2006 |
| KR | 10-2007-0092079 | 9/2007 |
| KR | 1020090072783 A | 7/2009 |

* cited by examiner

*Primary Examiner* — Ajay K Arora
(74) *Attorney, Agent, or Firm* — Robert E. Bushnell, Esq.

(57) ABSTRACT

An organic light emitting diode display includes a substrate main body, a plurality of organic light emitting diodes formed on the substrate main body, and a differential capping layer covering the plurality of organic light emitting diodes, the differential capping layer having a plurality of thicknesses. The differential capping layer has first regions with a thickness of 90 nm to 120 nm, and second regions with a thickness smaller than the thickness of the first regions.

24 Claims, 9 Drawing Sheets

ORGANIC LIGHT EMITTING DIODE DISPLAY DEVICE

CROSS-REFERENCE TO RELATED APPLICATIONS

This application claims the benefit of Korean Patent Application No. 10-2009-0096330 filed in the Korean Intellectual Property Office on Oct. 9, 2009, the disclosure of which is incorporated herein by reference.

BACKGROUND

1. Field

The described technology relates generally to an organic light emitting diode display, and more particularly, to an organic light emitting diode display with a differential capping layer.

2. Description of the Related Art

An organic light emitting diode (OLED) display is a self emissive display device that displays images with organic light emitting diodes. The organic light emitting diode display differs from a liquid crystal display (LCD) in that it does not require a separate light source, and has relatively small thickness and weight. Furthermore, as the organic light emitting diode display involves high quality characteristics such as low power consumption, high luminance, and short response time, it is spotlighted as a next generation display device for portable electronic appliances.

The organic light emitting diode usually includes an anode, a cathode, and an organic emissive layer disposed between the anode and the cathode. With the organic light emitting diode, holes from the anode and electrons from the cathode are combined within the organic emissive layer so as to form excitons being electron-hole pairs, and when the excitons return to the ground state, energy is generated to thereby emit light.

The anode and the cathode of the organic light emitting diode are formed with one of a reflective electrode and a semitransparent electrode, respectively. The organic light emitting diode has such an optical characteristic such that the maximum constructive interference occurs at a specific thickness per respective wavelengths of the emitted light.

However, all the organic light emitting diodes have the same thickness per respective color pixels, while the reflective electrode and the semitransparent electrode are differentiated in optical constructive interference from each other. Accordingly, it cannot be expected to achieve desired color reproducibility and optical efficiency with respect to all the colors.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an organic light emitting diode display having advantages of enhancing optical efficiency and color reproducibility.

An exemplary embodiment provides an organic light emitting diode display including a substrate main body, a plurality of organic light emitting diodes formed on the substrate main body, and a differential capping layer covering the plurality of organic light emitting diodes, the differential capping layer having different thicknesses. The differential capping layer has first regions with a thickness of 90 nm to 120 nm, and second regions having a thickness smaller than the thickness of the first regions.

According to another exemplary embodiment, the light emitted from the plurality of organic light emitting diodes may have two or more colors.

According to another exemplary embodiment, the differential capping layer may be formed on the plurality of organic light emitting diodes such that the differential capping layer differs in thickness per respective colors of the light emitted from the organic light emitting diodes.

According to another exemplary embodiment, the larger the wavelength of the light emitted from the organic light emitting diode, the greater the thickness of the differential capping layer formed on the organic light emitting diode.

According to another exemplary embodiment, the plurality of organic light emitting diodes may include a first organic light emitting diode emitting red-based light, a second organic light emitting diode emitting green-based light, and a third organic light emitting diode emitting blue-based light.

According to another exemplary embodiment, the differential capping layer may include a first capping layer formed on the first organic light emitting diode, a second capping layer formed on the second organic light emitting diode, and a third capping layer formed on the third organic light emitting diode.

According to another exemplary embodiment, the first region of the differential capping layer corresponds to the first capping layer, while the second regions of the differential capping layer corresponds to the second and third capping layers.

According to another exemplary embodiment, the second and third capping layers may have the same thickness of 60 nm to 100 nm.

According to another exemplary embodiment, the third capping layer may be thinner than the second capping layer.

According to another exemplary embodiment, the second capping layer may have a thickness of 70 nm to 100 nm, while the third capping layer may have a thickness of 60 nm to 90 nm.

According to another exemplary embodiment, the first regions of the differential capping layer may correspond to the first and second capping layers, while the second region of the differential capping layer corresponds to the third capping layer.

According to another exemplary embodiment, the first and second capping layers may have a same thickness, while the third capping layer has a thickness of 60 nm to 90 nm.

According to another exemplary embodiment, the first to third capping layers may all be formed of the same material.

According to another exemplary embodiment, at least one of the first to third capping layers may be formed of a different material than the other capping layers.

According to another exemplary embodiment, the differential capping layer may be formed with at least one organic or inorganic material selected from $SiO_2$, $SiN_x$, $SiON$, $ZnO_2$, $TiO_2$, $ZrO_2$, Alq3, CuPc, CBP, a-NPB, ITO, IZO, and $ZiO_2$.

According to another exemplary embodiment, the organic light emitting diode may include a first electrode, an organic emissive layer formed on the first electrode, and a second electrode formed on the organic emissive layer, while the differential capping layer is formed on the second electrode.

According to another exemplary embodiment, the first electrode may include a reflective layer, while the second electrode includes a semitransparent layer.

According to another exemplary embodiment, an encapsulation substrate may be placed over the differential capping layer and spaced apart from the differential capping layer by a distance such that the encapsulation substrate and the substrate main body are assembled with each other in a sealed manner.

According to another exemplary embodiment, an air layer may be formed between the encapsulation substrate and the differential capping layer.

According to another exemplary embodiment, the organic light emitting diode display may have enhanced optical efficiency and color reproducibility.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the exemplary embodiments of the present invention, examples of which are illustrated in the accompanying drawings, wherein like reference numerals refer to the like elements throughout. The embodiments are described below in order to explain the present invention by referring to the figures.

Furthermore, with other exemplary embodiments, detailed description is given for the constituent elements in the first exemplary embodiment with reference to the relevant drawings by using the same reference numerals for the same constituent elements, while only different constituent elements from those related to the first exemplary embodiment are described in other exemplary embodiments.

The parts that are irrelevant to the description are omitted in order to clearly describe the aspect of the present invention, and like reference numerals designate like elements throughout the specification.

Furthermore, as the size and thickness of the respective structural components shown in the drawings are arbitrarily illustrated for explanatory convenience, the aspect of the present invention are not necessarily limited to those illustrated.

In the drawings, the thickness of layers, films, panels, regions, etc., are exaggerated for clarity and explanatory convenience. It will be understood that when an element such as a layer, film, region, or substrate is referred to as being "on" another element, it can be directly on the other element or intervening elements may also be present.

Figure 1:
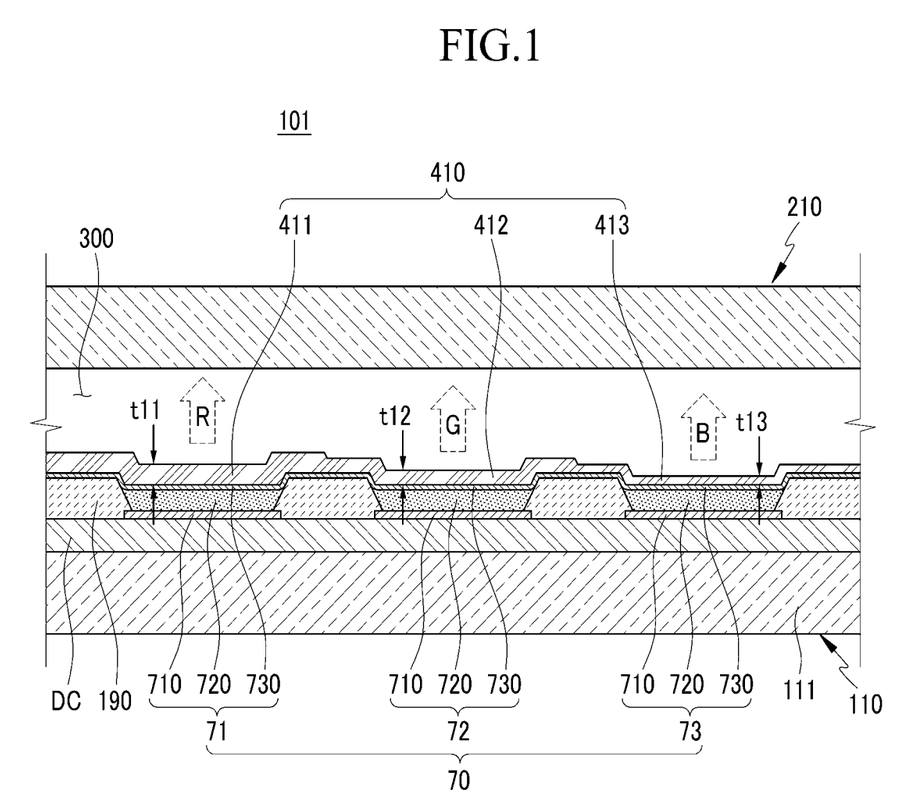
FIG. 1 is a cross-sectional view of an organic light emitting diode display according to an exemplary embodiment.

An organic light emitting diode display according to an exemplary embodiment will now be described with reference to FIG. 1. As shown in FIG. 1, an organic light emitting diode display 101 includes a display substrate 110, and an encapsulation substrate 210 assembled to the display substrate 110 in a sealed manner.

The display substrate 110 includes a substrate main body 111, a driving circuit DC, a plurality of organic light emitting diodes 70, and a differential capping layer 410.

The substrate main body 111 may be formed with an insulating substrate based on glass, quartz, ceramic, or plastic. However, the substrate main body 111 is not limited thereto and may be formed with a metallic substrate based on stainless steel or other metals. Furthermore, the substrate main body 111 is demarcated into a plurality of pixel regions spaced apart from each other by a distance, and a non-pixel area located at the periphery of the plurality of pixel regions.

The driving circuit DC is formed on the substrate main body 111. The driving circuit DC includes thin film transistors 10 and 20 (shown in FIG. 2), and drives the organic light emitting diodes 70. That is, the organic light emitting diodes 70 emit light in accordance with driving signals transmitted from the driving circuit DC so as to display images.

Figure 2:
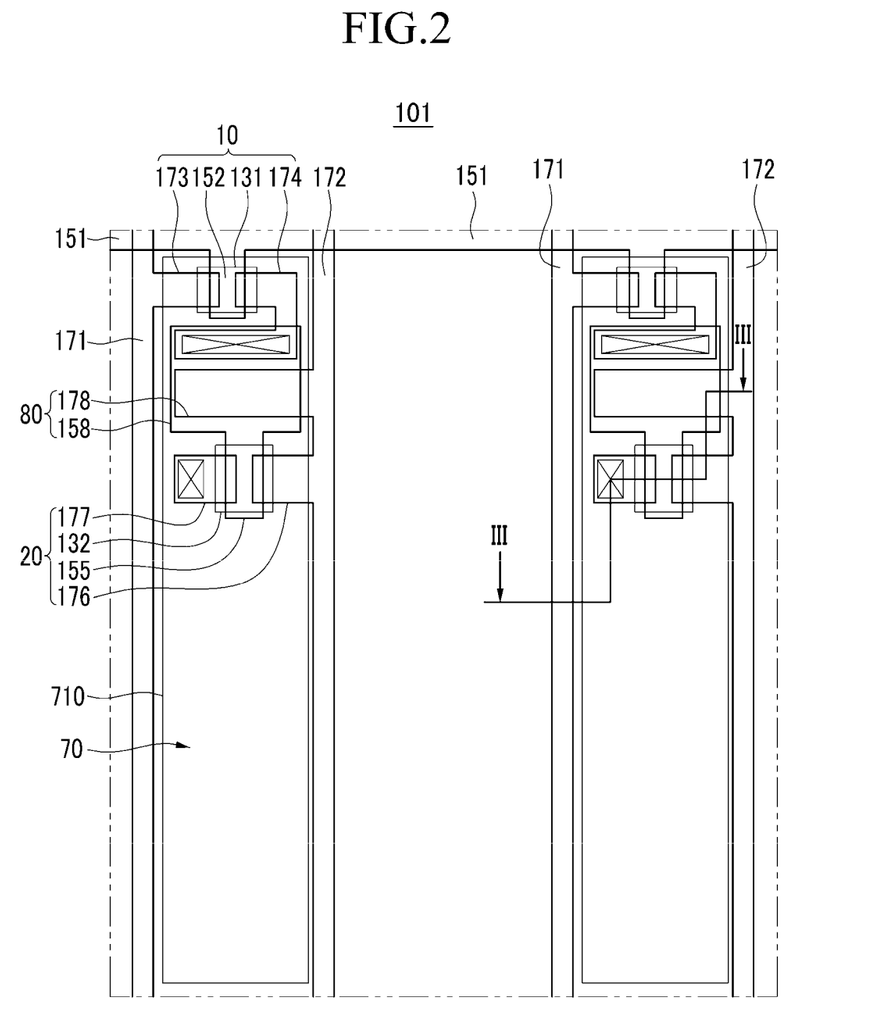
FIG. 2 is an amplified layout view of the organic light emitting diode display shown in FIG. 1.
Figure 3:
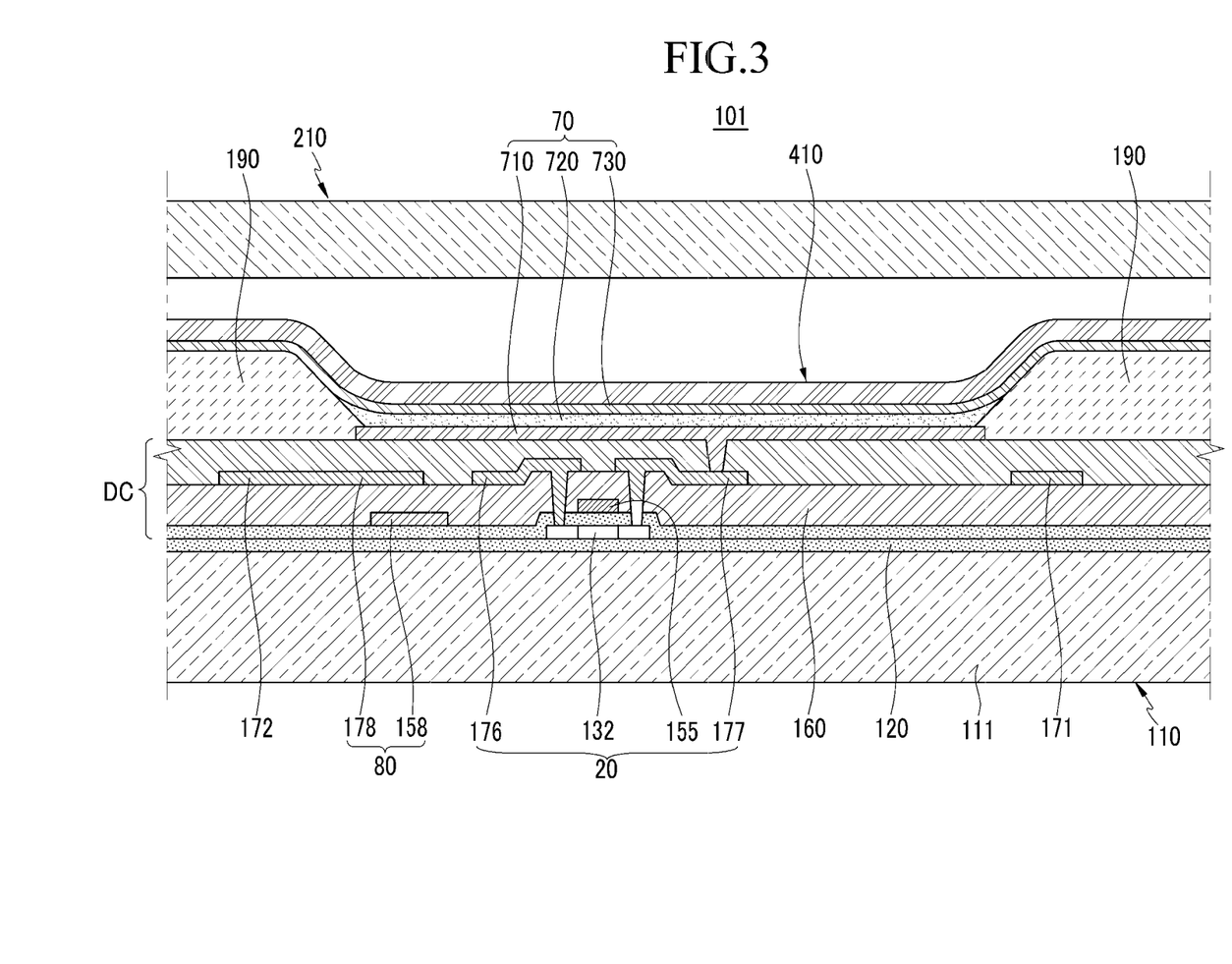
FIG. 3 is a cross-sectional view of the organic light emitting diode display taken along the III-III line of FIG. 2.

The specific structure of the driving circuit DC is illustrated in FIG. 2 and FIG. 3, but the driving circuit DC is not limited to the structure illustrated in FIG. 2 and FIG. 3. The structure of the driving circuit DC may be variously modified provided that such modifications can be easily made by a person skilled in the art.

The plurality of organic light emitting diodes 70 are formed at the plurality of pixel regions respectively so as to emit light in accordance with the driving signals transmitted from the driving circuit DC. The organic light emitting diode 70 includes a first electrode 710 being the anode, a second electrode 730 being the cathode, and an organic emissive layer 720 disposed between the first and second electrodes 710 and 730. However, the structure of the organic light emitting diode 70 is not limited thereto. That is, the first electrode 710 may function as the cathode while the second electrode 730 may function as the anode.

The first electrode 710, the organic emission layer 720, and the second electrode 730 are sequentially deposited on the substrate main body 111 at the pixel area.

The first electrode 710 is formed with a reflective layer, and the second electrode 730 is formed with a semitransparent layer. Accordingly, the light generated from the organic emissive layer 720 is emitted to the outside while passing through the second electrode 730. That is, the organic light emitting diode display 101 has a front emission structure.

The reflective layer and the semitransparent layer are formed by using at least one of magnesium (Mg), silver (Ag), gold (Au), calcium (Ca), lithium (Li), chromium (Cr), aluminum (Al), and alloys thereof. The reflective layer and the semitransparent layer are determined in reflectivity depending upon the thickness thereof. The semitransparent layer usually has a thickness of 200 nm or less. The larger the thickness of the semitransparent layer, the greater the light transmittance, whereas the smaller the thickness of the semitransparent layer, the lesser the light transmittance thereof.

Furthermore, the first electrode 710 may further include a transparent conductive layer. That is, the first electrode 710 may have a multiple-layered structure with a reflective layer and a transparent conductive layer. The transparent conductive layer may be formed by using a material such as indium tin oxide (ITO), indium zinc oxide (IZO), zinc oxide (ZnO), and indium oxide ($In_2O_3$). The transparent conductive layer has a relatively high work function, and is disposed between the reflective layer and the organic emissive layer 720. Furthermore, the first electrode 710 may have a triple-layered structure with a transparent conductive layer, a reflective layer, and a transparent conductive layer deposited sequentially.

Furthermore, the organic emissive layer 720 may also have a multiple-layered structure with some or all of an emission layer, a hole injection layer (HIL), a hole transporting layer (HTL), an electron transporting layer (ETL), and an electron injection layer (EIL). When the organic emissive layer 720 includes all of the layers, the hole injection layer (HIL) is disposed on the first electrode 710 being the anode, and is sequentially overlaid with the hole transporting layer (HTL), the emission layer, the electron transporting layer (ETL), and the electron injection layer (EIL). Furthermore, the organic emissive layer 720 may include other layers when needed.

The plurality of organic light emitting diodes 70 each emit any one of two color lights or more. With the illustrated exemplary embodiment, the plurality of organic light emitting diodes 70 include a first organic light emitting diode 71 emitting red-based light, a second organic light emitting diode 72 emitting green-based light, and a third organic light emitting diode 73 emitting blue-based light. However, the illustrated exemplary embodiment is not necessarily limited thereto. That is, the organic light emitting diode 70 may emit different color light.

The dotted line arrows of FIG. 1 indicate the direction of progression of the light, and the reference letters R, G and B represent the initials of the color light emitted from the organic light emitting diodes 70. That is, R represents red light, G represents green light, and B represents blue light.

Furthermore, the organic light emitting diode 70 of the exemplary embodiment is not limited to the above-described structure. The structure of the organic light emitting diode 70 may be modified provided that such modifications are easily made by a person skilled in the art.

The differential capping layer 410 is formed on the second electrode 730 of the organic light emitting diode 70 such that it covers the plurality of organic light emitting diodes 70. The differential capping layer 410 basically has a role of protecting the organic light emitting diodes 70 and simultaneously serves to make the light generated from the organic light emitting diode 70 be efficiently emitted to the outside.

Furthermore, the differential capping layer 410 has different thicknesses such that it has a thickness t11, t12, and t13. That is, the differential capping layer 410 has thicknesses t11, t12, and t13 that are differentiated per respective color light emitted from the plurality of organic light emitting diodes 70. The differential capping layer 410 includes a first capping layer 411 formed on the first organic light emitting diode 71, a second capping layer 412 formed on the second organic light emitting diode 72, and a third capping layer 413 formed on the third organic light emitting diode 73. The first capping layer 411 has the largest thickness t11, and the third capping layer 413 has the smallest thickness t13. The second capping layer 412 has a thickness t12 that is smaller than the first capping layer 411 but larger than the third capping layer 413.

Specifically, the first capping layer 411 has a thickness t11 of 90 nm to 120 nm. The second capping layer 412 has a thickness t12 of 70 nm to 100 nm. The third capping layer 413 has a thickness t13 of 60 nm to 90 nm. That is, the larger the wavelength of the light emitted from the organic light emitting diode 70, the thicker the differential capping layer 410 formed on the relevant organic light emitting diode 70.

The first capping layer 411, the second capping layer 412, and the third capping layer 413 are all formed of the same material. The differential capping layer 410 is formed with a least one organic or inorganic material of $SiO_2$, SiNx, SiON, $ZnO_2$, $TiO_2$, $ZrO_2$, Alq3, CuPc, CBP, a-NPB, ITO, IZO, and $ZiO_2$.

As described above, the organic light emitting diode display 101 includes a differential capping layer 410 formed on the organic light emitting diodes 70, such that the maximum constructive interference can be made to depend on the respective wavelengths of the light emitted from the organic light emitting diodes 70. When the first capping layer 411, the second capping layer 412, and the third capping layer 413 deviate from the predetermined thickness t11, t12, and t13, the constructive interference of the light emitted from the first to third organic light emitting diodes 71, 72 and 73 is weakened thereby deteriorating the overall optical characteristics of the organic light emitting diode display 101. That is, the first capping layer 411, the second capping layer 412, and the third capping layer 413 have optimal thicknesses t11, t12, and t13 so as to make the maximum optical interference correction per the relevant organic light emitting diodes 70.

Accordingly, the organic light emitting diode display 101 can maximize the optical efficiency per respective colors by way of the differential capping layer 410. Furthermore, as the optical efficiency is maximized per respective colors, the overall color reproducibility of the organic light emitting diode display 101 is enhanced.

The display substrate 110 further includes a pixel definition layer 190. The pixel definition layer 190 has an opening exposing the first electrode 710 of the organic light emitting diode 70. That is, the pixel definition layer 190 corresponds to the non-pixel area of the substrate main body 111, and the opening of the pixel definition layer 190 corresponds to the pixel area of the substrate main body 111.

The encapsulation substrate 210 is assembled to the display substrate 110 in a sealed manner so as to protect the organic light emitting diode 70 and the driving circuit DC. Specifically, a sealant (not shown) is formed along the edge of the encapsulation substrate 210 to thereby seal the substrate main body 111 and the encapsulation substrate 210 to each other. The encapsulation substrate 210 may be formed with a transparent insulating substrate based on glass, quartz, ceramic, or plastic.

The encapsulation substrate 210 is placed over the organic light emitting diode 70 while being spaced apart therefrom by a distance. An air layer 300 is formed between the differential capping layer 410 and the encapsulation substrate 210.

With the above-described structure, the organic light emitting diode display 101 has effectively enhanced optical efficiency and color reproducibility.

The internal structure of the organic light emitting diode display 101 will now be described in detail with reference to FIG. 2 and FIG. 3. FIG. 2 is a layout view of a pixel structure based on the display substrate 110, and FIG. 3 is a cross sectional view of the display substrate 110 and the encapsulation substrate 210 taken along the III-III line of FIG. 2.

FIG. 2 and FIG. 3 illustrate an active matrix (AM) organic light emitting diode display 101 having a 2Tr-1Cap structure with two thin film transistors (TFT) 10 and 20 and one capacitor 80 at each pixel, but the exemplary embodiment is not limited thereto. That is, the organic light emitting diode display 101 may have three or more thin film transistors and two or more capacitors at each pixel, and various other structures with separate wires. Here, a pixel refers to a minimum image displaying unit, and is disposed at each pixel region. The organic light emitting diode display 101 displays images through a plurality of pixels.

As shown in FIG. 2 and FIG. 3, the display substrate 110 includes a switching thin film transistor 10, a driving thin film transistor 20, a capacitor 80, and an organic light emitting diode 70, which are formed at each pixel. Here, the driving circuit DC refers to the structure with the switching thin film transistor 10, the driving thin film transistor 20, and the capacitor 80. The display substrate 110 further includes gate lines 151 arranged in a direction, and data and common power lines 171 and 172 crossing the gate lines 151 in an insulated manner.

One pixel is defined by the gate lines 151 and the data and common power lines 171 and 172 as a boundary, but not limited thereto.

The organic light emitting diode 70 includes a first electrode 710, an organic emissive layer 720 formed on the first electrode 710, and a second electrode 730 formed on the organic emissive layer 720. Holes and electrons from the first and the second electrodes 710 and 730 are injected into the organic emissive layer 720. The light emission occurs when the excitons being the combinations of holes and electrons drop from the excited state to the ground state.

The capacitor 80 has a pair of capacitor plates 158 and 178 separated by an interlayer insulating layer 160. Here, the interlayer insulating layer 160 functions as a dielectric. The capacitance is determined depending upon the charges charged at the capacitor 80 and the voltages of the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting a pixel to be excited. The switching gate electrode 152 is connected to the gate line 151. The switching source electrode 173 is connected to the data line 171. The switching drain electrode 174 is spaced apart from the switching source electrode 173 by a distance, and is connected to one of the capacitor plates 158.

The driving thin film transistor 20 applies power for driving the organic emissive layer 720 of the organic light emitting diode 70 within the selected pixel to the pixel electrode 710. The driving gate electrode 155 is connected to the capacitor plate 158 connected with the switching drain electrode 174. The driving source electrode 176 and the other capacitor plate 178 are each connected to the common power line 172. The driving drain electrode 177 is connected to the pixel electrode 710 of the organic light emitting diode 70 through a contact hole.

With the above structure, the switching thin film transistor 10 is operated by the gate voltage applied to the gate line 151, and transmits the data voltage applied to the data line 171 to the driving thin film transistor 20. A voltage corresponding to a difference between the common voltage applied from the common power line 172 to the driving thin film transistor 20 and the data voltage transmitted from the switching thin film transistor 10 is stored at the capacitor 80, and the current corresponding to the voltage stored at the capacitor 80 flows to the organic light emitting diode 70 through the driving thin film transistor 20 so that the organic light emitting diode 70 emits light.

The light generated from the organic light emitting diode 70 is emitted to the outside while passing through the differential capping layer 410. The differential capping layer 410 has a differential structure such that the maximum constructive interference can be made per respective wavelengths of the light. Accordingly, the organic light emitting diode display 101 may effectively enhance the optical efficiency and the color reproducibility.

Figure 4:
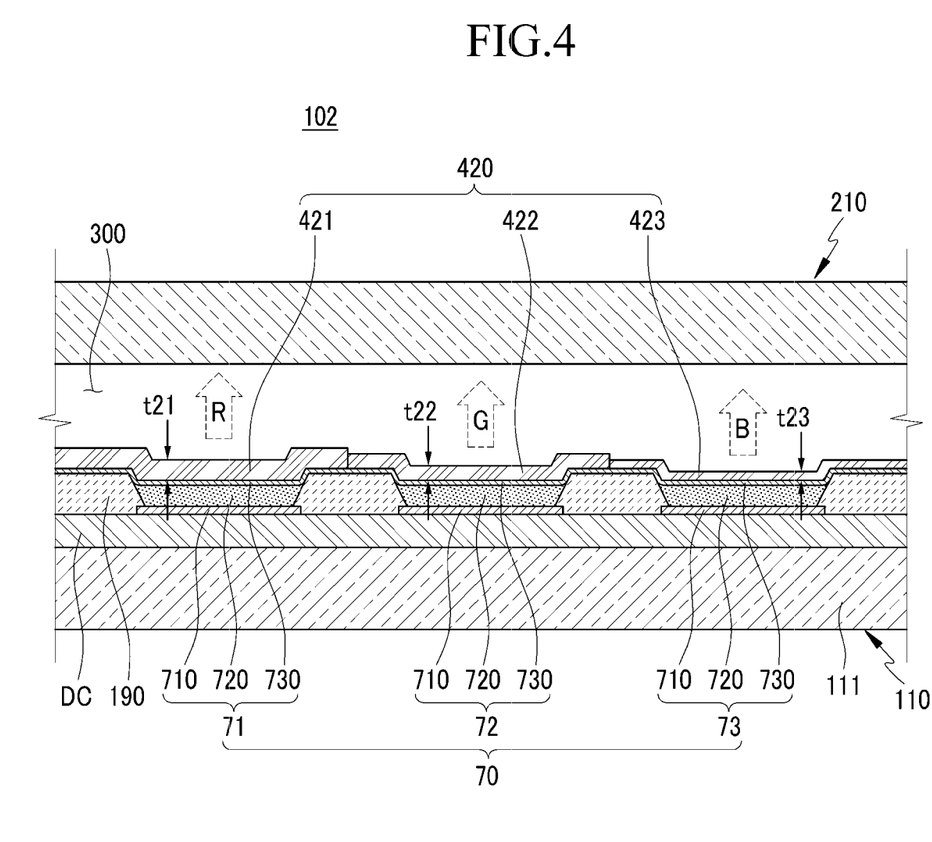
FIG. 4 is a cross-sectional view of an organic light emitting diode display according to another exemplary embodiment.

Another exemplary embodiment will now be described with reference to FIG. 4. As shown in FIG. 4, an organic light emitting diode display 102 includes a differential capping layer 420 with first to third capping layers 421, 422, and 423 that are differentiated such that at least one layer is formed with a different material from the material for the other layers. For example, the first to third capping layers 421, 422 and 423 may all be formed of different materials. That is, the first to third capping layers 421, 422 and 423 may be each formed with a material having a refractive index and characteristic that are appropriate for the wavelength of the light transmitted therethrough.

The reference symbols t21, t22, and t23 of FIG. 4 indicate the thickness of the respective capping layers 421, 422, and 423.

With the above structure, the organic light emitting diode display may enhance the optical efficiency and the color reproducibility more effectively.

Figure 5:
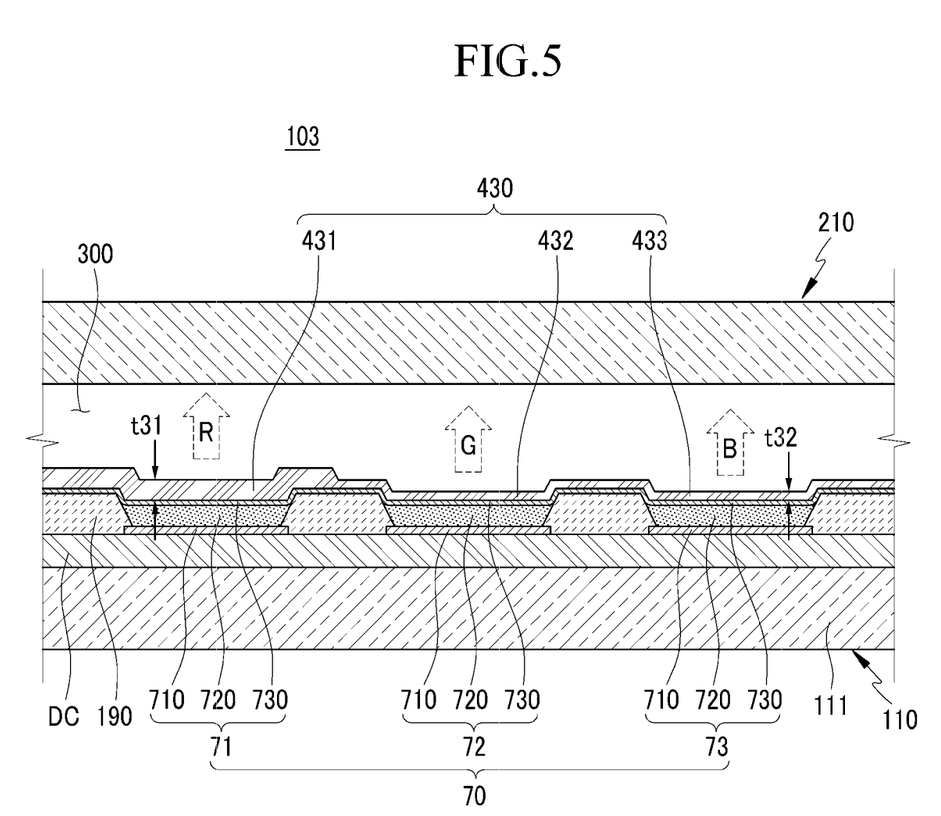
FIG. 5 is a cross-sectional view of an organic light emitting diode display according to another exemplary embodiment.

A further exemplary embodiment will now be described with reference to FIG. 5. As shown in FIG. 5, the organic light emitting diode display 103 has a differential capping layer 430 having a first capping layer 431 with the largest thickness t31, and second and third capping layers 432 and 433 with a thickness t32 that is smaller than the thickness of the first capping layer 431. Specifically, the first capping layer 431 has a thickness t31 of 90 nm to 120 nm. The second and the third capping layers 432 and 433 have a thickness t32 of 60 nm to 100 nm.

In the exemplary embodiment illustrated in FIG. 1, where the capping layer 410 is formed with three different thickness dimensions t11, t12, and t13 or more, the optical efficiency and the color reproducibility are maximized, but the manufacturing process becomes complicated. In the exemplary embodiment illustrated in FIG. 5, the thicknesses t31 and t32 of the differential capping layer 430 depends on the constructive interference of the organic light emitting diodes 70. Specifically, the differential capping layer 430 has two different thickness dimensions t31 and t32 according to the first organic light emitting diode 71 emitting the red-based light and the third organic light emitting diode 73 emitting the blue-based light. In the exemplary embodiment illustrated in FIG. 5, the differential capping layer 430 formed on the second organic light emitting diode 72, that is, the second capping layer 432, has the same thickness as the differential capping layer formed on the third organic light emitting diode 73, that is, the third capping layer 433.

With the above structure, the organic light emitting diode display 103 illustrated in FIG. 5, may enhance the optical efficiency and the color reproducibility while simplifying the manufacturing process.

Figure 6:
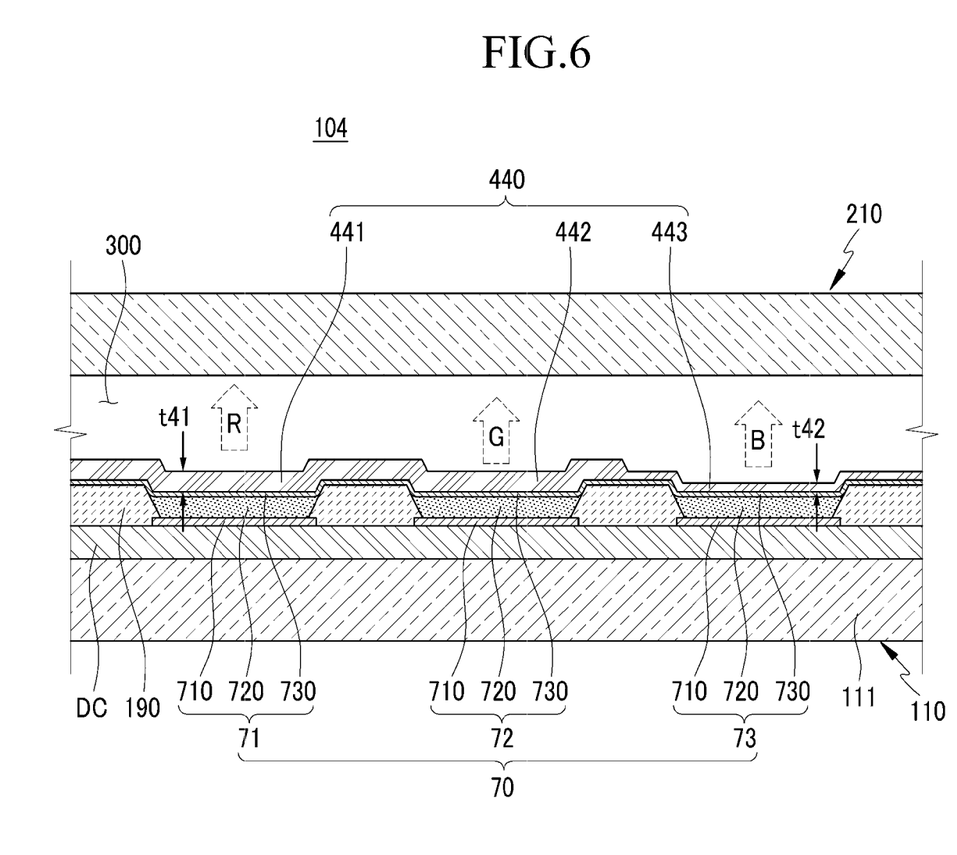
FIG. 6 is a cross-sectional view of an organic light emitting diode display according to another exemplary embodiment.

Another exemplary embodiment will be now described with reference to FIG. 6. As shown in FIG. 6, the organic light emitting diode display 104 has a differential capping layer 440 having first and second capping layers 441 and 442 each with the largest thickness t41, and a third capping layer 443 with a thickness t42 that is smaller than the thickness of the first and second capping layers 441 and 442. Specifically, the first capping layer 441 and the second capping layer 442 have a thickness t41 of 90 nm to 120 nm. The third capping layer 443 has a thickness t42 of 60 nm to 90 nm.

As with the exemplary embodiment illustrated in FIG. 1, in case the differential capping layer 410 has three thickness dimensions t11, t12, and t13 or more, the optical efficiency and the color reproducibility are maximized, but the manufacturing process becomes complicated. Accordingly, with the exemplary embodiment illustrated in FIG. 6, the thicknesses t41 and t42 of the differential capping layer 440 are established to be well adapted to some of the organic light emitting diodes 70 where the constructive interference pursuant to the thickness controlling is made more effectively. Specifically, the differential capping layer 440 has two thickness dimensions t41 and t42 adapted to the first organic light emitting diode 71 emitting the red-based light and the third organic light emitting diode 73 emitting the blue-based light. In the exemplary embodiment illustrated in FIG. 6, the differential capping layer 440 formed on the second organic light emitting diode 72, that is, the second capping layer 442, has the same thickness as the differential capping layer 440 formed on the first organic light emitting diode 71, that is, the first capping layer 441.

With the above structure, the organic light emitting diode display 104 illustrated in FIG. 6 may enhance the optical efficiency and the color reproducibility while simplifying the manufacturing process.

Examples of the aspects of the present invention, related to the embodiment illustrated in FIG. 2, will be now described with reference to FIG. 7 and FIG. 8. Organic light emitting diode displays 101 having differential capping layers 410 that are differentiated in thickness were tested so as to measure the optical efficiency thereof per respective colors.

Figure 7:
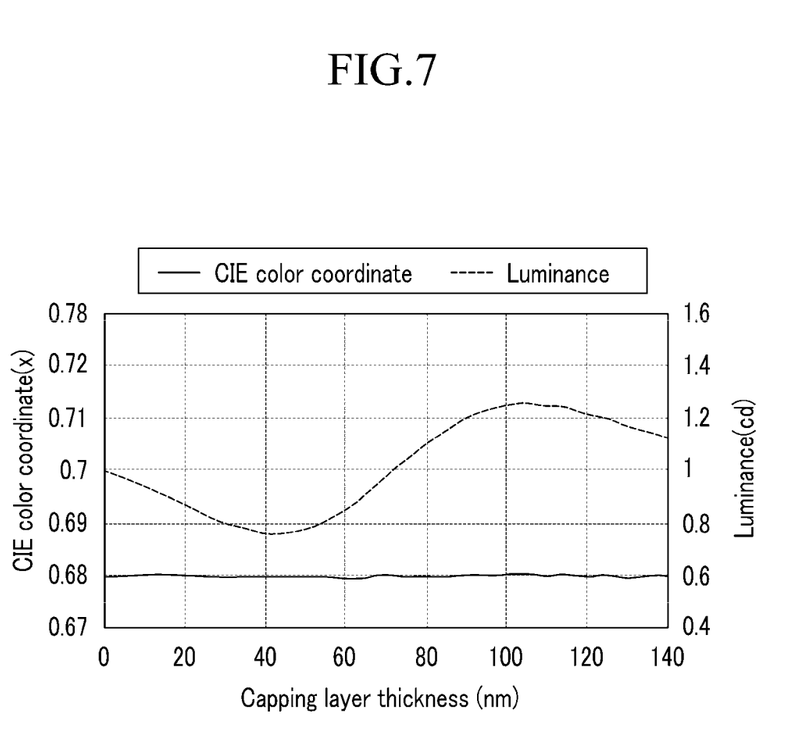
FIG. 7 to FIG. 9 are graphs illustrating the optical efficiency per color of organic light emitting diode displays according to examples.

FIG. 7 is a graph illustrating the optical efficiency when the differential capping layer 410 formed on an organic light emitting diode 71 emitting a red-based color is varied in thickness. As shown in FIG. 7, the organic light emitting diode 71 emitting red-based light exhibited the highest optical efficiency when the differential capping layer 410 had a thickness of 90 nm to 120 nm.

Figure 8:
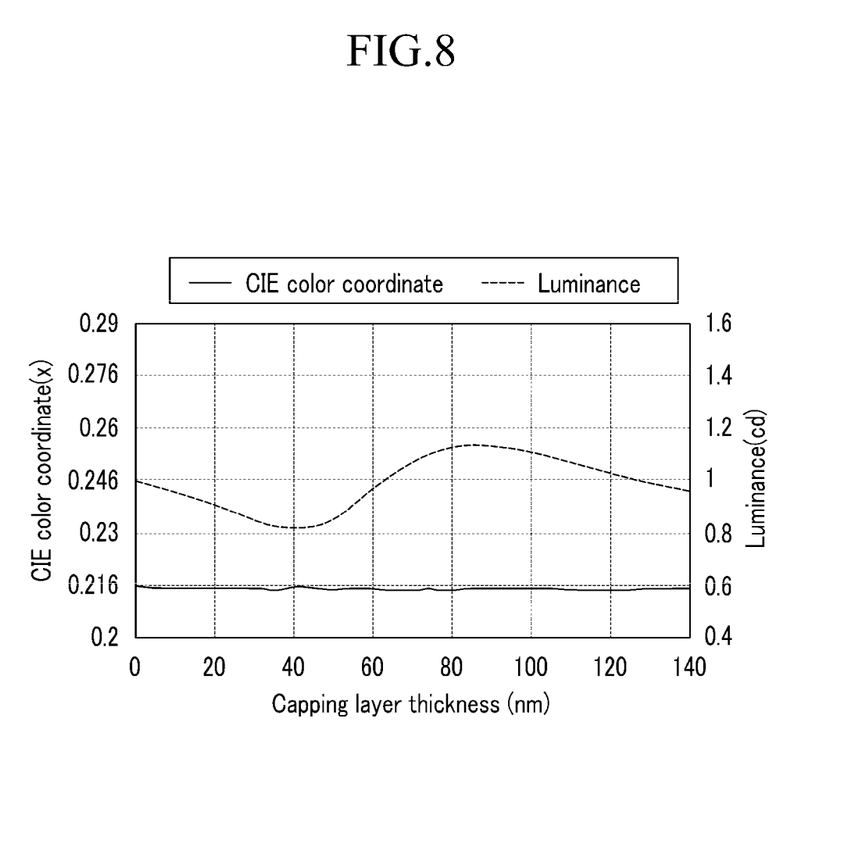

FIG. 8 is a graph illustrating the optical efficiency when the differential capping layer 410 formed on an organic light emitting diode 72 emitting a green-based color is varied in thickness. As shown in FIG. 8, the organic light emitting diode 72 emitting green-based light exhibited the highest optical efficiency when the differential capping layer 410 had a thickness of 70 nm to 100 nm.

Figure 9:
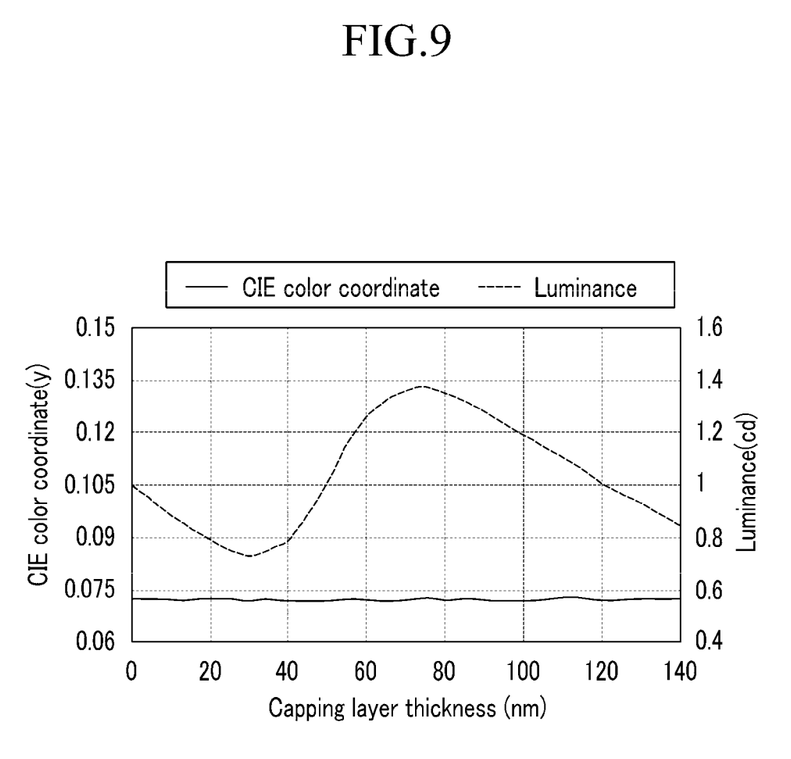

FIG. 9 is a graph illustrating the optical efficiency when the differential capping layer 410 formed on an organic light emitting diode 73 emitting a blue-based color is varied in thickness. As shown in FIG. 9, the organic light emitting diode 73 emitting blue-based light exhibited the highest optical efficiency when the differential capping layer 410 had a thickness of 60 nm to 90 nm.

It can be known from the examples that the organic light emitting diode display 101 according to the embodiment illustrated in FIG. 1 maximizes the optical efficiency per respective colors by way of the differential capping layer 410. Furthermore, as the optical efficiency is maximized per respective colors, the overall color reproducibility of the organic light emitting diode display 101 is enhanced.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode display device, comprising:
   a substrate main body;
   a plurality of organic light emitting diodes formed on the substrate main body, each one of the plurality of organic light emitting diodes comprising a first electrode, an organic emissive layer formed on the first electrode, and a second electrode formed on the organic emissive layer; and
   a differential capping layer of different thickness covering the plurality of organic light emitting diodes,
   wherein the differential capping layer comprises first regions having an even thickness and second regions with another even thickness different from the thickness of the first regions, and the first regions correspond to the organic light emitting diodes emitting having a first color and the second regions correspond to the organic light emitting diodes emitting light having at least two colors different from the first color.

2. The organic light emitting diode display device of claim 1, wherein the light emitted from the plurality of organic light emitting diodes has two or more colors.

3. The organic light emitting diode display device of claim 2, wherein the differential capping layer is formed on the plurality of organic light emitting diodes such that the differential capping layer is differentiated in thickness per respective colors of the light emitted from the organic light emitting diodes.

4. The organic light emitting diode display device of claim 3, wherein the larger the wavelength of the light emitted from the organic light emitting diode, the greater the thickness of the differential capping layer formed on the organic light emitting diode.

5. The organic light emitting diode display device of claim 2, wherein the plurality of organic light emitting diodes comprise a first organic light emitting diode emitting red-based light, a second organic light emitting diode emitting green-based light, and a third organic light emitting diode emitting blue-based light.

6. The organic light emitting diode display device of claim 5, wherein the differential capping layer comprises a first capping layer formed on the first organic light emitting diode, a second capping layer formed on the second organic light emitting diode, and a third capping layer formed on the third organic light emitting diode.

7. The organic light emitting diode display device of claim 6, wherein the first regions of the differential capping layer corresponds to the first capping layer, and the second regions of the differential capping layer correspond to the second and third capping layers.

8. The organic light emitting diode display device of claim 7, wherein the second and third capping layers have a same thickness of 60 nm to 100 nm, 9. The organic light emitting diode display device of claim 7, wherein a thickness of the third capping layer is smaller than a thickness of the second capping layer.

10. The organic light emitting diode display device of claim 9, wherein the second capping layer has a thickness of 70 nm to 100 nm, and the third capping layer has a thickness of 60 nm to 90 nm.

11. The organic light emitting diode display device of claim 6, wherein the first regions of the differential capping layer correspond to the first capping layer and second capping layer, and the second region of the differential capping layer corresponds to the third capping layer.

12. The organic light emitting diode display device of claim 11, wherein the first capping layer and second capping layer have a same thickness, and the third capping layer has a thickness of 60 nm to 90 nm.

13. The organic light emitting diode display device of claim 6, wherein the first to third capping layers are all formed of the same material.

14. The organic light emitting diode display device of claim 6, wherein at least one of the first to third capping layers is formed of a different material than the other capping layers.

15. The organic light emitting diode display device of claim 1, wherein the differential capping layer is formed with at least one organic or inorganic material selected from the group consisting of $SiO_2$, SiNx, SiON, $ZnO_2$, $TiO_2$, $ZrO_2$, Alq3, CuPc, CBP, a-NPB, ITO, IZO, and $ZiO_2$.

16. The organic light emitting diode display device of claim 1, wherein the differential capping layer is formed on the second electrode.

17. The organic light emitting diode display device of claim 1, wherein the first electrode comprises a reflective layer, and the second electrode comprises a semitransparent layer.

18. The organic light emitting diode display device of claim 1, further comprising an encapsulation substrate placed over the differential capping layer and spaced apart from the differential capping layer by a distance such that the encapsulation substrate and the substrate main body are assembled with each other in a sealed manner.

19. The organic light emitting diode display device of claim 18 further comprising an air layer formed between the encapsulation substrate and the differential capping layer.

20. An organic light emitting diode display device, comprising:
   a main substrate;
   a plurality of organic light emitting diodes emitting light of different colors formed on the main substrate, each one of the plurality of organic light emitting diodes comprising a first electrode, an organic emissive layer formed on the first electrode, and a second electrode formed on the organic emissive layer; and
   a differential capping layer comprising first regions having an even thickness and second regions with another even thickness different from the thickness of the first regions, the first regions corresponding to the organic light emitting diodes emitting light having a first color, and the second regions corresponding to the organic light emitting diodes emitting light having at least two colors different from the first color.

21. The organic light emitting diode display device of claim 20, wherein a material of the differential capping layer formed on the organic light emitting diode emitting a red-based light is different than a material of the differential capping layer formed on the organic light emitting diode emitting a green-based light, and the material of the differential capping layer formed on the organic light emitting diode emitting the green-based light is different than a material of the differential capping layer formed on the organic light emitting diode emitting a blue-based light.

22. The organic light emitting diode display device of claim 20, wherein a thickness of the differential capping layer formed on the organic light emitting diode emitting a red-based light is greater than a thickness of the differential capping layer formed on the organic light emitting diode emitting a green-based light, and the thickness of the differential capping layer formed on the organic light emitting diode emitting the green-based light is the same as a thickness of the differential capping layer formed on the organic light emitting diode emitting a blue-based light.

23. The organic light emitting diode display device of claim 20, wherein a thickness of the differential capping layer formed on the organic light emitting diode emitting a red-based light is the same as a thickness of the differential capping layer formed on the organic light emitting diode emitting a green-based light, and the thickness of the differential capping layer formed on the organic light emitting diode emitting the green-based light is greater than a thickness of the differential capping layer formed on the organic light emitting diode emitting a blue-based light.

24. An organic light emitting diode display device, comprising:
   a main substrate;
   a plurality of organic light emitting diodes formed on the main substrate, each one of the plurality of organic light emitting diodes comprising a first electrode, an organic emissive layer formed on the first electrode, and a second electrode formed on the organic emissive layer; and
   a differential capping layer formed on the plurality of organic light emitting diodes,
   wherein the differential capping layer comprises first regions having an even thickness and second regions with another even thickness different from the thickness of the first regions, the first regions correspond to the organic light emitting diodes emitting light having a first color, and the second regions correspond to the organic light emitting diodes emitting light having at least two colors different from the first color.

* * * * *